(12) United States Patent
Choi et al.

(10) Patent No.: US 8,468,663 B2
(45) Date of Patent: Jun. 25, 2013

(54) METHOD FOR MANUFACTURING AN APPARATUS FOR GENERATING ELECTRIC ENERGY

(75) Inventors: Dukhyun Choi, Hwaseong-si (KR); Jaeyoung Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/459,627

(22) Filed: Apr. 30, 2012

(65) Prior Publication Data

US 2012/0210565 A1 Aug. 23, 2012

Related U.S. Application Data

(62) Division of application No. 12/535,967, filed on Aug. 5, 2009, now Pat. No. 8,227,957.

(30) Foreign Application Priority Data

Apr. 6, 2009 (KR) .................. 10-2009-0029584

(51) Int. Cl.
*H04R 17/10* (2006.01)
*H05K 3/10* (2006.01)

(52) U.S. Cl.
USPC .............. 29/25.35; 29/842; 29/846; 977/837; 977/882

(58) Field of Classification Search
USPC .. 29/25.35, 594, 842, 846; 310/339; 977/837, 977/882, 890; 313/495, 498, 508
See application file for complete search history.

(56) References Cited

U.S. PATENT DOCUMENTS

| | | | |
|---|---|---|---|
| 7,839,028 B2 | 11/2010 | Pinkerton | |
| 7,936,111 B2 | 5/2011 | Choi et al. | |
| 7,936,112 B2 | 5/2011 | Choi et al. | |
| 7,968,359 B2 | 6/2011 | Hersee | |
| 8,003,982 B2 | 8/2011 | Wang et al. | |
| 8,039,834 B2 | 10/2011 | Wang et al. | |
| 8,039,854 B2 | 10/2011 | Hersee et al. | |
| 2008/0041446 A1 | 2/2008 | Wu et al. | |
| 2008/0067618 A1 | 3/2008 | Wang et al. | |
| 2008/0067915 A1* | 3/2008 | Ishida et al. | 313/495 |
| 2009/0179523 A1 | 7/2009 | Wang et al. | |
| 2009/0309456 A1 | 12/2009 | Stollberg | |
| 2010/0117488 A1 | 5/2010 | Wang et al. | |
| 2010/0136414 A1 | 6/2010 | Choi et al. | |
| 2010/0141095 A1 | 6/2010 | Park | |

(Continued)

FOREIGN PATENT DOCUMENTS

JP 2004193325 A * 7/2004

OTHER PUBLICATIONS

Lei et al; "Ordered Arrays of Nanostructures and Applications in High-Efficient Nano-Generators"; Advanced Engineering Materials; vol. 9; No. 5; 2007; pp. 343-348.

(Continued)

*Primary Examiner* — A. Dexter Tugbang
(74) *Attorney, Agent, or Firm* — Cantor Colburn LLP

(57) ABSTRACT

A method for manufacturing an apparatus for generating electrical energy may include; disposing a nanowire including a piezoelectric material on a first electrode, disposing an active layer, which is electrically connected to the nanowire, on the first electrode, disposing an insulating film on the nanowire, disposing a conductive layer on the active layer, and disposing a second electrode in proximity to the nanowire and substantially opposite to the first electrode.

8 Claims, 12 Drawing Sheets

U.S. PATENT DOCUMENTS

2011/0050042 A1     3/2011    Choi et al.
2011/0138610 A1     6/2011    Choi et al.
2011/0163636 A1     7/2011    Sirbuly et al.

OTHER PUBLICATIONS

Kayes et al; "Comparison of the device physics principles of planar and radial p-n junction nanorod solar cells"; Journal of Applied Physics; vol. 97; 114302; 2005; pp. 1-11.

Wang et al; "Integrated Nanogenerators in Biofluid"; Nano Letters; vol. 7; No. 8; 2007; pp. 2475-2479.

Jensen et al; "Nanotube Radio"; Nano Letters; vol. 7; No. 11; 2007; pp. 3508-3511.

Wang et al; "Voltage Generation from Individual BaTiO3 Nanowires under Periodic Tensile Mechanical Load"; Nano Letters; vol. 7; No. 10; 2007; pp. 2966-2969.

Qin et al; "Microfibre-nanowire hybrid structure for energy scavenging"; Nature; vol. 451; 2008; pp. 809-814.

Law et al; "Nanowire dye-sensitized solar cells"; Nature; vol. 4; 2005; pp. 455-459.

McDevitt et al; "Tumor Therapy with Targeted Atomic Nanogenerators"; Science; vol. 294; 2001; pp. 1537-1540.

Gao et al; "Nanowire Piezoelectric Nanogenerators on Plastic Substrates as Flexible Power Sources for Nanodevices" Advanced Materials, 2007, 19, pp. 67-72.

Wang et al; Piezoelectric Nanogenerators Based on Zinc Oxide Nanowire Arrays; Science; vol. 312; 2006; pp. 242-246.

Wang et al: "Direct-Current Nanogenerator Driven by Ultrasonic Waves"; Science; vol. 316; 2007; pp. 102-105.

U.S. Appl. No. 12/482,147 "Apparatus for Generating Electrical Energy and Method for Manufacturing the Same" filed Jun. 10, 2009.

U.S. Appl. No. 13/034,041 "Apparatus for Generating Electrical Energy and Method for Manufacturing the Same" filed Feb. 24, 2011.

U.S. Appl. No. 12/408,274 "Apparatus for Storing Energy and Method for Manufacturing the Same" filed Mar. 20, 2009.

\* cited by examiner

METHOD FOR MANUFACTURING AN APPARATUS FOR GENERATING ELECTRIC ENERGY

CROSS-REFERENCE TO RELATED APPLICATION

This application is a divisional of U.S. patent application Ser. No. 12/535,967, filed on Aug. 5, 2009, now U.S. Pat. No. 8,227,957, which claims priority to Korean Patent Application No. 10-2009-0029584, filed on Apr. 6, 2009, and all the benefits accruing therefrom under 35 U.S.C. §119, the content of which in its entirety is herein incorporated by reference.

BACKGROUND

1. Field

Disclosed herein are an apparatus for generating electrical energy and a method for manufacturing the apparatus for generating electrical energy.

2. Description of the Related Art

With the recent advent of miniaturized high-performance devices in the field of electronics, the development and use of nanoscale devices have become more prevalent. In order to manufacture nanodevices, a technique of producing nanowires has been previously developed. A nanowire is typically a wire with a diameter of several tens of nanometers. The nanowire may have an aspect ratio from about 10 to about several thousands, e.g., the length of the nanowires may be from about 10 times, to several thousand times, its width.

The nanowire may have electrical, chemical, physical and optical properties that are different from the general properties of the same material when it is in bulk form. Increasingly miniaturized and integrated devices may be implemented using the molecular properties of the nanowires in conjunction with some of the bulk properties thereof. Nanowires may be used in various fields such as laser, transistor, memory, sensor, and other similar applications.

More recently, miniaturization is being combined with versatility and mobility to produce mobile devices that can perform a variety of different functions. In order to produce sustainable mobile devices, batteries having an adequate power supply are desirable. However, the development of battery capacity for power supply presently lags behind the integration of functionality into these mobile devices. Therefore, the use of an auxiliary battery is desirable, and the development of the auxiliary battery for use as an emergency power source, and the enablement of a wireless rechargeability may also be desirable.

SUMMARY

Disclosed herein are an apparatus for generating electrical energy which may generate electrical energy by absorbing light such as sunlight or in response to an applied stress or signal in the case where the light is unavailable, and a method for manufacturing the apparatus for generating electrical energy.

An exemplary embodiment of an apparatus for generating electrical energy includes; a first electrode, a second electrode spaced apart from the first electrode, a nanowire which includes a piezoelectric material and is disposed on the first electrode, an active layer disposed on the first electrode, a conductive layer disposed on the active layer, and an insulating film disposed between the conductive layer and the nanowire, wherein the nanowire and the active layer may be electrically connected to each other.

An exemplary embodiment of a method for manufacturing an apparatus for generating electrical energy includes; disposing a nanowire including a piezoelectric material on a first electrode, disposing an active layer, which is electrically connected to the nanowire, on the first electrode, disposing an insulating film on the nanowire, disposing a conductive layer on the active layer, and disposing a second electrode in proximity to the nanowire and substantially opposite to the first electrode.

BRIEF DESCRIPTION OF THE DRAWINGS

The above and other aspects, features and advantages of the disclosed exemplary embodiments will be more apparent from the following detailed description taken in conjunction with the accompanying drawings in which:

FIG. 3A(ii) is an enlarged view of the area 3A(ii) of FIG. 3A(i);

FIG. 3B(ii) is an enlarged view of the area 3A(ii) of FIG. 3B(i);

DETAILED DESCRIPTION

Figure 1:
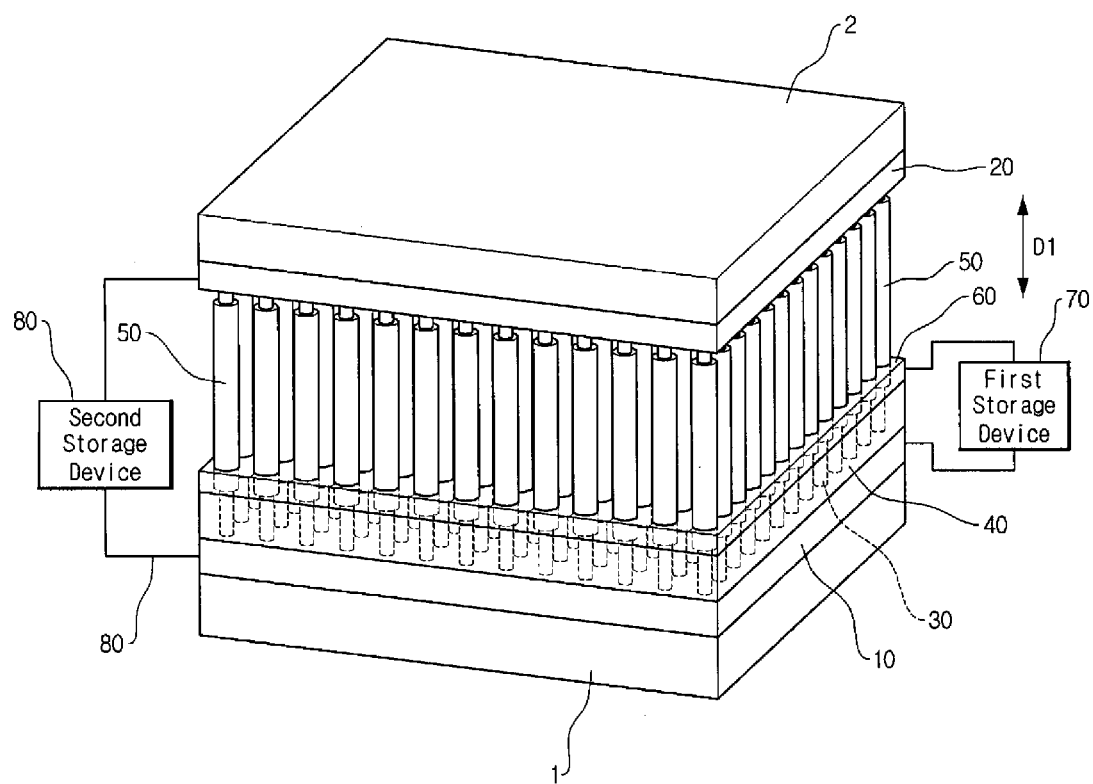
FIG. 1 is a front perspective view illustrating an exemplary embodiment of an apparatus for generating electrical energy.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented exemplary embodiments.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular exemplary embodiments only and is not intended to be limiting of this disclosure. As used herein, the singular forms "a", "an" and "the" are intended to include the plural forms as well, unless the context clearly indicates otherwise. Furthermore, the use of the terms a, an, etc. do not denote a limitation of quantity, but rather denote the presence of at least one of the referenced item. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

FIG. 1 is a front perspective view illustrating an exemplary embodiment of an apparatus for generating electrical energy.

Referring to FIG. 1, the apparatus for generating electric energy may include a first electrode 10, a second electrode 20, a nanowire 30, an active layer 40, an insulation film 50, and a conductive layer 60.

The first electrode 10 is a lower electrode, which supports the nanowire 30 thereon. In one exemplary embodiment, the first electrode 10 may be formed on a substrate 1. For example, in one exemplary embodiment the first electrode 10 may be formed as a metal film or a ceramic element exhibiting conductivity. In such an exemplary embodiment, the first electrode 10 is formed on the substrate 1. Exemplary embodiments of the substrate 1 may be formed of glass, silicon (Si), polymer, sapphire, gallium nitride (GaN), silicon carbide (SiC), or other materials having similar characteristics.

The second electrode 20 may be spaced apart from the first electrode 10. Similarly to the first electrode 10, exemplary embodiments include configurations wherein the second electrode 20 may be formed on a substrate 2. For example, in one exemplary embodiment the first and the second electrodes 10 and 20 may be formed by forming conductive materials on the respective substrates 1 and 2 by plating, sputtering, e-beam evaporation, thermal evaporation, or other similar methods.

The first and the second electrodes 10 and 20 may include at least one of a metal, indium tin oxide ("ITO"), carbon nanotubes ("CNTs"), graphene, conductive polymer, nanofibers, nanocomposites, other materials having similar characteristics and a combination thereof. In an exemplary embodiment wherein the first and second electrodes are formed from metal, the metal may be at least one of a gold-palladium (Au—Pd) alloy, gold (Au), palladium (Pd), platinum (Pt), ruthenium (Ru), other materials with similar characteristics and a combination thereof.

In one exemplary embodiment, at least one of the first and the second electrodes 10 and 20 may be made of a transparent material. Furthermore, exemplary embodiments include configurations wherein at least one of the first and the second electrodes 10 and 20 may be made of a flexible electrode which may be deformed by an applied stress. The application of stresses to the substrates 1 and 2 will be described in more detail below with respect to FIG. 2B.

Exemplary embodiments of the substrates 1 and 2 on which the first and the second electrodes 10 and 20 are formed, respectively, may also be made of a transparent material such as a glass, polymer or other material with similar characteristics. Further, each of the substrates 1 and 2 may be made of a flexible material which may be deformed by an applied stress.

One or more nanowires 30 may be disposed on the first electrode 10. Exemplary embodiments of the nanowire 30 may be made of a piezoelectric material in which a potential difference is generated when physically deformed. For example, in one exemplary embodiment the nanowire may include at least one of a zinc oxide (ZnO), lead-zirconate-titanate ("PZT"), barium titanate ($BaTiO_3$), other piezoelectric materials with similar characteristics and a combination thereof.

The nanowire 30 may be grown on the first electrode 10. Growing the nanowire 30 on the first electrode 10 rather than directly on the substrate 1 may present several advantages. In an exemplary embodiment, a conductivity of a nanowire energy generating system may be improved over an embodiment wherein the nanowires is grown directly on the substrate 1, since the nanowire 30 is formed on the conductive first electrode 10. Furthermore, it may become easier to control the growth of the nanowire 30, e.g., the nanowire 30 may be grown vertically on the first electrode 10. Furthermore, a uniformity of the shapes or longitudinal directions of the nanowires 30 may be improved.

In the present exemplary embodiment, the nanowire 30 may extend in a direction substantially perpendicular to the surfaces of the first and the second electrodes 10 and 20. Alternative exemplary embodiments include configurations wherein the nanowire 30 may extend to be inclined in a direction which is not substantially perpendicular to the surfaces of the first and the second electrodes 10 and 20. The number of the nanowires 30 illustrated in the figures is only an example, and the number of the nanowires 30 may be varied depending on the size and applications of the apparatus, e.g., exemplary embodiments include configurations with additional or fewer nanowires 30 than that illustrated in FIG. 1.

The active layer 40 may be disposed on the first electrode 10 on which the nanowire 30 is formed. After forming one or more nanowires 30 on the first electrode 10, the active layer 40 may be formed on substantially the entire surface of the first electrode 10. As a result, the one or more nanowires 30 may be disposed to penetrate the active layer 40. The active layer 40 and the nanowire 30 may be electrically connected to each other, e.g., they may be electrically connected via an outer surface of the nanowire 30 disposed in contact with the active layer 40.

Exemplary embodiments of the active layer 40 may include an organic material, an inorganic material, an organic-inorganic composite, or other materials with similar characteristics. For example, in one exemplary embodiment the inorganic material which may be used for the active layer 40 may include silicon or a compound semiconductor such as copper indium gallium (di)selenide ("CIGS"). Furthermore, in one exemplary embodiment the organic material which may be used for the active layer 40 may include a dye-sensitized material such an oxide semiconductor on which a dye molecule is adsorbed.

In one exemplary embodiment, the conductive layer 60 may be disposed on the active layer 40. Exemplary embodiments of the conductive layer 60 may be made of metal or other conductive materials having similar characteristics. For example, in one exemplary embodiment the conductive layer 60 may include at least one of a metal, ITO, CNT, graphene, conductive polymer, nanofibers, nanocomposite, other materials having similar characteristics and a combination thereof. In the exemplary embodiment wherein the conductive layer 60 is the metal, at least one of AuPd, Au, Pd, Pt, Ru, other materials having similar characteristics and a combination thereof may be used. In an exemplary embodiment, the conductive layer 60 may be made of a transparent material. Furthermore, exemplary embodiments include configurations wherein the conductive layer 60 may be made of a flexible material which may be deformed by a stress.

In one exemplary embodiment, the insulating film 50 may be disposed between the conductive layer 60 and the nanowire 30. In such an exemplary embodiment, the insulating film 50 may be formed to surround the surfaces of the nanowire 30. Since the insulating film 50 is formed of a nonconductive material, the conductive layer 60 and the nanowire 30 may be electrically separated by the insulating film 50.

In an exemplary embodiment, the insulating film 50 may be made of a piezoelectric material similarly to the nanowire 30. For example, in one exemplary embodiment the insulating film 50 may include at least one of PZT, $BaTiO_3$, other piezoelectric materials having similar characteristics and a combination thereof. Since the insulating film 50 is made of the piezoelectric material, the nanowire 30 is electrically separated from the conductive layer 60, and at the same time, the piezoelectric characteristics of the nanowire 30 may be improved by the insulating film 50.

When light, such as sunlight, is incident on the apparatus for generating electrical energy, the active layer 40 absorbs the light to generate an electrical energy. The active layer 40 may be electrically connected to the conductive layer 60, and may also be electrically connected to the first electrode 10 by way of the nanowire 30, i.e., the portion of the nanowire 30 disposed within the active layer 40 and not surrounded by the insulation film 50. When the first electrode 10 and the conductive material 60 are electrically connected using a conductive material, current may flow though a closed-circuit including the first electrode 10, the active layer 40, and the conductive layer 60. In an exemplary embodiment, a first storage device 70 may be electrically connected between the first electrode 10 and the conductive layer 60 to store the electrical energy generated from the active layer 40. Exemplary embodiments of the first storage device 70 include capacitors and batteries and other storage media.

Figure 2A:
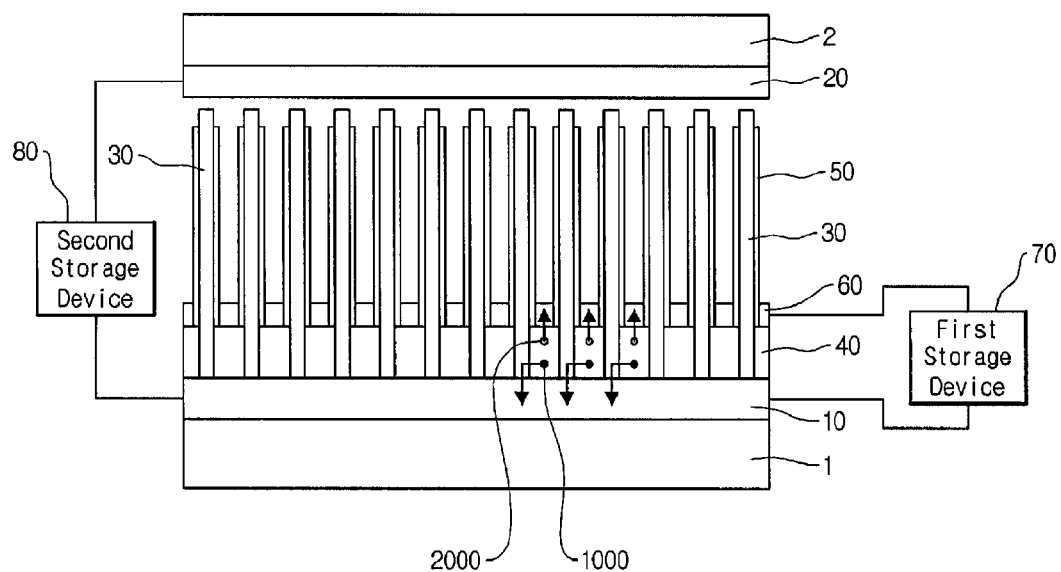
FIG. 2A is a cross-sectional view illustrating an exemplary embodiment of an apparatus for generating electrical energy.
Figure 2B:
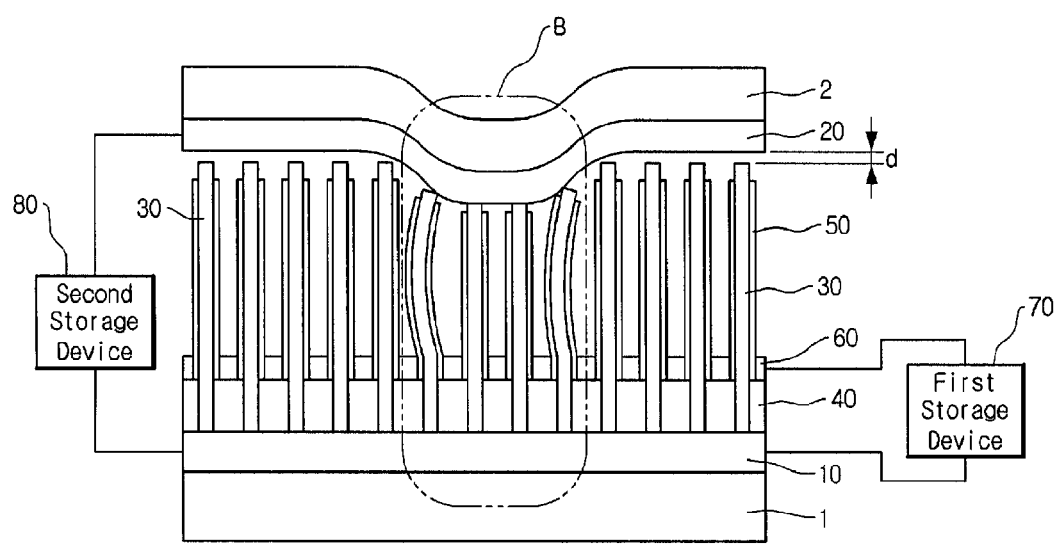
FIG. 2B is a cross-sectional view illustrating an exemplary embodiment of an apparatus for generating electrical energy to which a stress is applied.

As shown in FIG. 2B, when a stress is applied to the apparatus for generating electrical energy, the nanowire 30 made of the piezoelectric material may be deformed and an electric potential may be generated in the nanowire 30. Furthermore, the deformed nanowire 30 may be in contact with the second electrode 20. When the first and the second electrodes 10 and 20 are electrically connected using a conductive material, e.g. the nanowire 30, current may flow through a closed-circuit including the first electrode 10, the nanowire 30, and the second electrode 20. In an exemplary embodiment, a second storage device 80 may be electrically connected between the first and the second electrodes 10 and 20 to store the electrical energy generated from the nanowire 30. Exemplary embodiments of the second storage device 80 include capacitors and batteries and other storage media.

As described above, the first and the second storage devices 70 and 80 may include a rechargeable battery, capacitor, or other suitable means for storing electrical energy. For example, in one exemplary embodiment the first and the second storage devices 70 and 80 may include a nickel-cadmium battery, a nickel-hydrogen battery, a lithium ion battery, a lithium polymer battery or other battery having similar characteristics. Furthermore, the first and the second storage devices 70 and 80 may further include an amplifier (not shown) for amplifying voltage.

The apparatus for generating electrical energy described above may generate electrical energy by absorbing incident light, or in response to an applied stress, or both. By forming at least one of the first and second electrodes 10 and 20 of the apparatus for generating electrical energy in an array type, a touch sensor which may detect a position where the stress is applied may be implemented. Furthermore, by electrically connecting a plurality of the apparatuses for generating electrical energy in an array type, the electrical energy generated from the apparatuses for generating electrical energy may be amplified.

FIG. 2a is a cross-sectional view illustrating an exemplary embodiment of an apparatus for generating electrical energy. With reference to FIG. 2a, operations of the active layer 40 in the apparatus for generating electrical energy will be described in detail.

When light such as sunlight is incident on the apparatus for generating electrical energy, part or all of the incident light may reach the active layer 40. At least one of the first electrode 10, the second electrode 20 and the conductive layer 60 may be made of a transparent material to allow sunlight to reach the active layer 40. Furthermore, the substrates 1 and 2 on which the first and the second electrodes 10 and 20 are formed, respectively, may be made of a transparent material.

When electrons in the active layer 40 absorb energy from the incident light, excitons in the excited state may be formed. The exciton may be separated into an electron 1000 and a hole 2000 due to an electromagnetic field produced by a difference in work function between materials adjacent to the active layer 40. Then, the electron 1000 and the hole 2000 may be moved in different, e.g., opposite, directions by the electromagnetic field. For example, the electron 1000 may be moved from the active layer 40 toward the first electrode 10 through the nanowire 30, and the hole 2000 may be moved from the active layer 40 toward the conductive layer 60.

Accordingly, an electric potential difference may be generated between the first electrode 10 and the conductive layer 60. When the first electrode 10 and the conductive layer 60 are electrically connected using the active layer 40 and a first storage device 70, current may flow through a closed-circuit including the first electrode 10, the active layer 40, and the conductive layer 60. In an exemplary embodiment, by electrically connecting a first storage device 70 between the first electrode 10 and the conductive 60, electrical energy generated by the active layer 40 may be stored in the first storage device 70.

Light may be incident on the active layer 40 from an upper portion or a lower portion, or both, of the apparatus for generating electrical energy. In the exemplary embodiment where the light is incident on the active layer 40 from the upper portion of the apparatus for generating electrical energy, electrical energy generation efficiency of the active layer 40 may be improved by inducing focusing of the incident light using the at least one nanowires 30.

As described above, when light, such as sunlight, is incident on the apparatus for generating electrical energy according to an exemplary embodiment, electrical energy may be generated as the active layer 40 absorbs the light. Furthermore, the generated electrical energy may be stored in the first storage device 70.

FIG. 2B is a cross-sectional view illustrating an exemplary embodiment of an apparatus for generating electrical energy to which a stress is applied. With reference to FIG. 2B, operations of the nanowire 30 of the apparatus for generating electrical energy will be described in detail.

While a stress is not applied to the apparatus for generating electrical energy, the nanowire 30 may be spaced apart from the second electrode 20 by a distance "d". The distance d between the nanowire 30 and the second electrode 20 may be determined to be a distance that the nanowire 30 comes in contact with the second electrode 20 when a stress is applied to the second or the first electrode 20 or 10. Alternative exemplary embodiments include configurations wherein the nanowire 30 may be in contact with the second electrode 20 while a stress is not applied, e.g., the distance "d" may be zero.

As a stress is applied to a portion B of the apparatus for generating electrical energy, the second electrode 20 and the substrate 2 may be bent downward. As a result, the distance between the first and the second electrodes 10 and 20 decreases, so that the nanowire 30 disposed in the portion B may be pressed and deformed. Since the nanowire 30 is made of the piezoelectric material, an electric potential difference is generated in the deformed nanowire 30.

When the first and the second electrodes 10 and 20 are electrically connected using a conductive material, e.g., the nanowire 30, current may flow through the closed-circuit including the first electrode 10, the nanowire 30, and the second electrode 20. Furthermore, by electrically connecting a second storage device 80 between the first and the second electrodes 10 and 20, the electrical energy generated by the nanowire 30 may be stored in the second storage device 80.

In FIG. 2B, an exemplary embodiment wherein a shape in which the second electrode 20 is bent by the stress applied to the upper portion of the apparatus for generating electrical energy is illustrated as an example. However, when a stress is applied to the first electrode 10, or when a stress is applied to both of the first and the second electrodes 10 and 20, the same effects may be obtained. That is, the electrical energy may be generated by pressing or bending the apparatus for generating electrical energy on either, or both, sides thereof.

In order to prevent the nanowire 30 from being broken when a stress is applied to the apparatus for generating electrical energy, an elastic material (not shown) such as silicone, polydimethylsiloxane ("PDMS"), or urethane may be provided on the conductive layer 60. Here, the elastic material may be formed to have a suitable thickness such that the elastic material does not prevent the nanowire 30 from being deformed by the stress.

The piezoelectric material forming each of the nanowires 30 may have semiconductor characteristics. For example, in one exemplary embodiment a nanowire 30 made of undoped ZnO has n-type semiconductor characteristics. In such an exemplary embodiment, due to the semiconductor characteristic of the nanowire 30, a Schottky contact may be formed on a contact surface of the nanowire 30 and the second electrode 20. When the Schottky contact is formed, relatively greater electrical energy may be obtained as compared with an embodiment where electrical energy is generated only by the piezoelectric effect of the nanowire 30.

As described above, when the distance between the first and the second electrodes 10 and 20 is decreased as a stress is applied to the apparatus for generating electrical energy, current flows due to the piezoelectric characteristics of the nanowire 30. Therefore, electrical energy may be generated in response to the applied stress. Furthermore, the generated electrical energy may be stored in the second storage device 80.

Figure 3A:
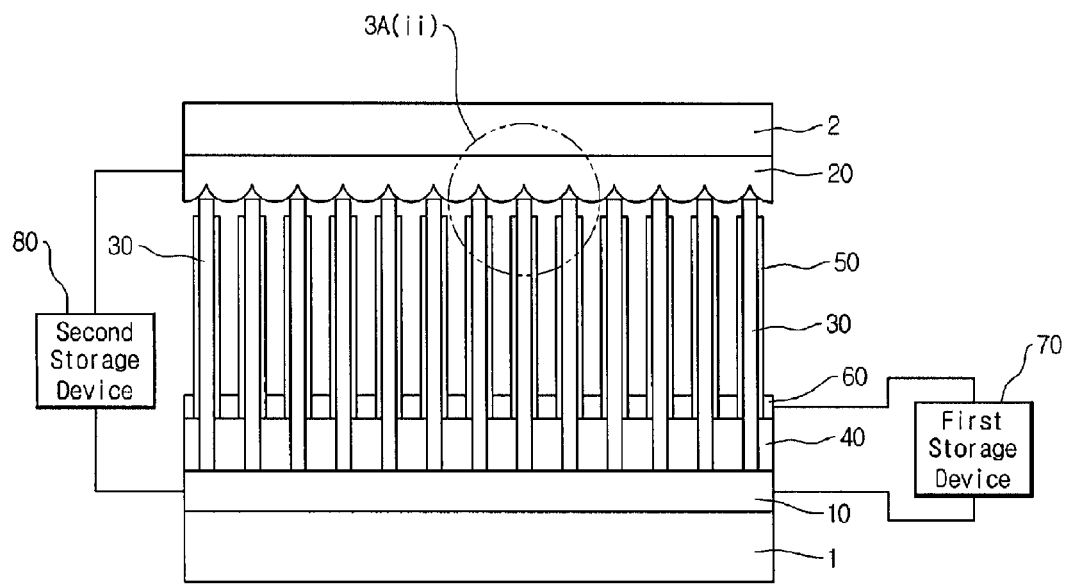
FIG. 3A(i) is a cross-sectional view illustrating another exemplary embodiment of an apparatus for generating electrical energy.
Figure 3A:
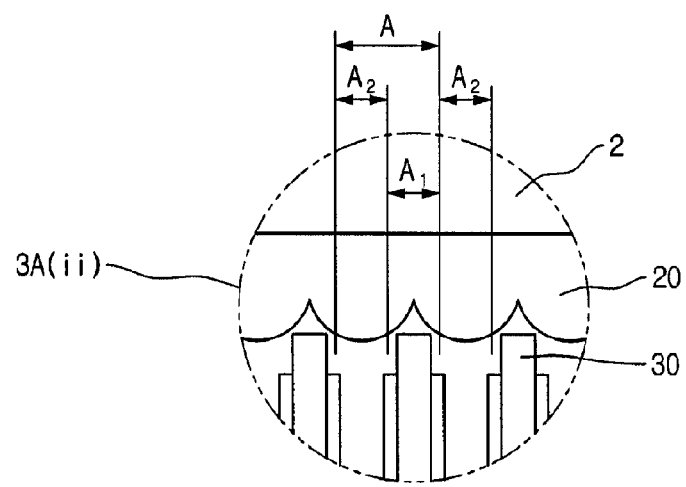

FIG. 3A(i) is a cross-sectional view illustrating another exemplary embodiment of an apparatus for generating electrical energy, and FIG. 3A(ii) is an enlarged view of the portion 3A(ii) of FIG. 3A(i).

Referring to FIG. 3A(i), the second electrode 20 of the apparatus for generating electrical energy may include an uneven portion A. For example, the uneven portion A of the second electrode 20 may have a ripple-shape structure including one or more concave portions A1 and one or more convex portions A2. In an exemplary embodiment, the uneven portion A may include a curved surface or an inclined surface. For example, in the exemplary embodiment illustrated in FIG. 3A, the second electrode 20 may include the uneven portion A of which a cross-section is semicircular. In the exemplary embodiment wherein the second electrode 20 includes the uneven portion A, the nanowire 30 may be disposed in proximity to the concave portion A1 of the uneven portion A of the second electrode 20.

Since the configuration of the apparatus for generating electrical energy illustrated in FIG. 3A(i) is substantially similar to that in the exemplary embodiment described above with reference to FIG. 2A, except for the shape of the second electrode 20, a detailed description thereof will be omitted for the purpose of brevity.

Figure 3B:
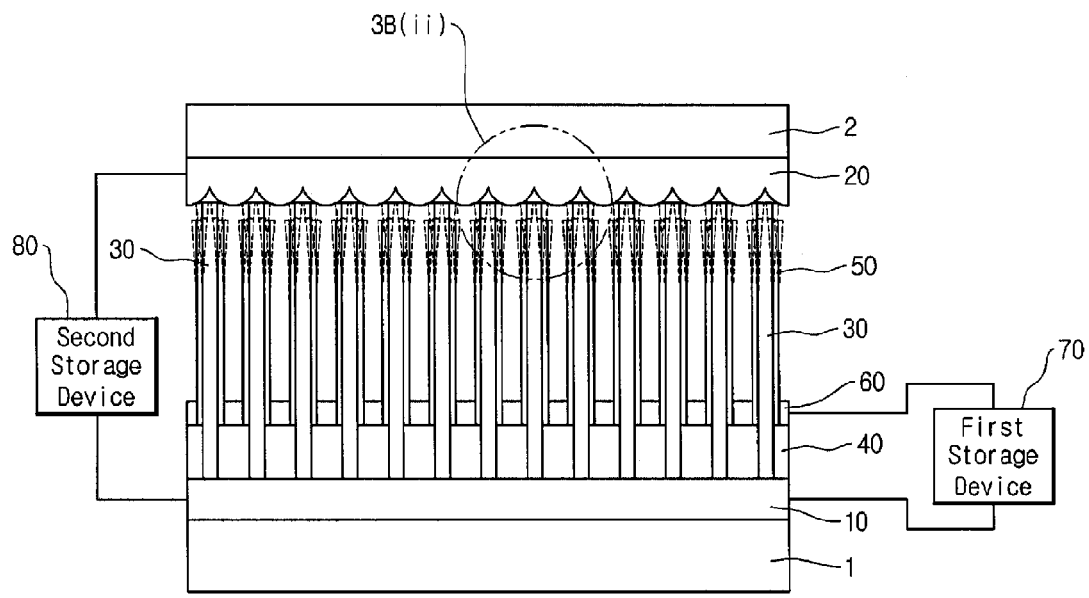
FIG. 3B(i) is a cross-sectional view illustrating an exemplary embodiment of an apparatus for generating electrical energy to which a signal is applied such that the nanowire resonates.
Figure 3B:
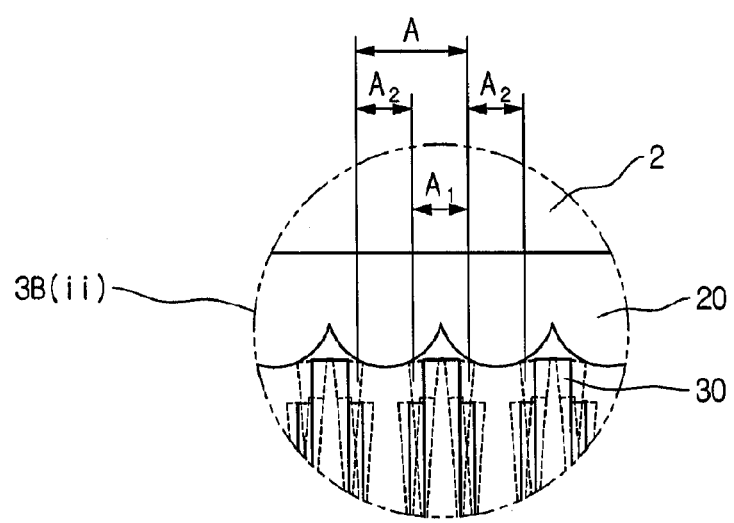

FIG. 3B(i) is a cross-sectional view illustrating a state where the nanowire 30 vibrates due to a resonance in the apparatus for generating electrical energy illustrated in FIG. 3A(i), and FIG. 3B(ii) is an enlarged view of the area 3B(ii) of FIG. 3B(i).

Referring to FIG. 3b, a signal having a frequency corresponding to a resonance frequency of the nanowire 30 may be applied to the apparatus for generating electrical energy. In one exemplary embodiment, the signal may be applied wirelessly. In an exemplary embodiment, the signal may be an electromagnetic wave. Further, in one exemplary embodiment the signal may be a radio frequency ("RF") wave. For example, in one exemplary embodiment the RF wave may have a frequency of from about 3 kHz to about 300 MHz.

The nanowire 30 may have high elasticity in addition to high tensile strength. When a signal is applied to the nanowire 30, and the frequency of the applied signal corresponds to the resonance frequency of the nanowire 30, the nanowire 30 may resonate due to the energy transmitted from the signal. For example, in an exemplary embodiment wherein the electromagnetic wave having the frequency corresponding to the resonance frequency of the nanowire 30 is applied to the nanowire 30, electrons of the nanowire 30 may be moved by the effect of an electromagnetic field generated by the electromagnetic wave. As a result, the nanowire 30 may resonate due to the electromagnetic wave and vibrate in both directions of the electromagnetic wave.

Since the nanowire 30 is made of the piezoelectric material, an electric potential difference is generated in the bent nanowire 30. The nanowire 30 may be disposed in proximity to the concave portion A1 of the uneven portion A of the second electrode 20. Therefore, the bent nanowire 30 may be at least partially in contact with the second electrode 20. Since the second electrode 20 does not have a potential while the bent nanowire 30 has a potential, current may be generated between the nanowire 30 and the second electrode 20.

As described above, by applying the signal having the frequency corresponding to the resonance frequency of the nanowire 30 to the apparatus for generating electrical energy according to an exemplary embodiment, an electrical energy may be generated in the nanowire 30.

Although FIG. 3B(i) illustrates an exemplary embodiment in which electrical energy is generated by resonating the nanowire 30 in the apparatus for generating electrical energy illustrated in FIG. 3A(i), the electrical energy may also be generated from the nanowire 30 by applying a stress to the apparatus for generating electrical energy illustrated in FIG. 3A(i). This may be understood by those skilled in the art from the exemplary embodiment described above with reference to FIG. 2B. Therefore, a detailed description thereof will be omitted for the purpose of brevity.

FIGS. 4A to 4F are cross-sectional views illustrating exemplary embodiments of processes of manufacturing the portion of a first electrode in an exemplary embodiment of an apparatus for generating electrical energy.

Figure 4A:
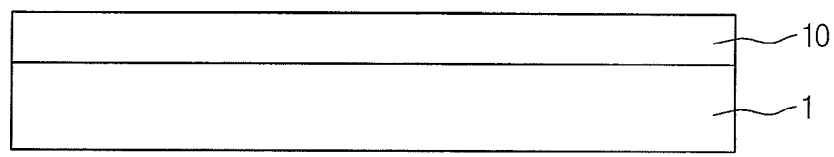
FIGS. 4A to 4F are cross-sectional views illustrating processes of an exemplary embodiment of a method for manufacturing an exemplary embodiment of an apparatus for generating electrical energy.

Referring to FIG. 4A, the first electrode 10 may be formed on the substrate 1. In an exemplary embodiment, the substrate 1 may be a substrate made of glass, Si, polymer, sapphire, GaN, SiC, or other materials having similar characteristics as described above. In one exemplary embodiment, the first electrode 10 may be made of a conductive material. Exemplary embodiments include configurations wherein the first electrode 10 may be formed by plating, sputtering, e-beam evaporation, thermal evaporation, or other similar methods. The first electrode 10 may function as the lower electrode supporting the nanowire which is to be formed subsequently.

Figure 4B:
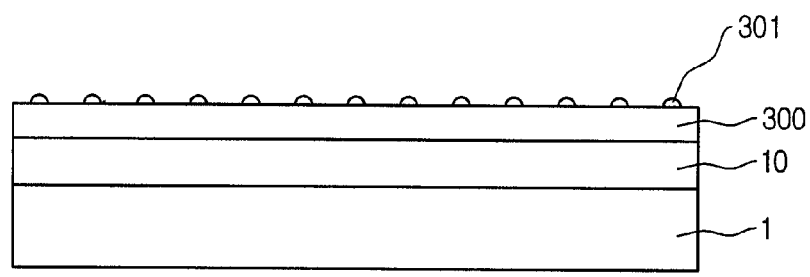

Referring to FIG. 4B, a nanomaterial layer 300 and nano-nuclei 301 may be formed as a seed layer on the first electrode 10. The nanomaterial layer 300 and nano-nuclei 301 may be formed on the first electrode 10 to have a small thickness by spin coating, dip coating, evaporation, or other similar methods. For example, in one exemplary embodiment the nanomaterial layer 300 and nano-nuclei 301 may have a thickness of from about 3 nm to about 50 nm. In an exemplary embodiment, the nanomaterial layer 300 and nano-nuclei 301 may be made of zinc acetate. By heating the substrate 1 on which the nanomaterial layer 300 and nano-nuclei 301 are formed, the adhesion between the nanomaterial layer 300 and the first electrode 10 or between the nanomaterial layer 300 and nano-nuclei 301 may be improved. For example, in one exemplary embodiment the substrate 1 may be heated up a temperature of about 100° C.

Figure 4C:
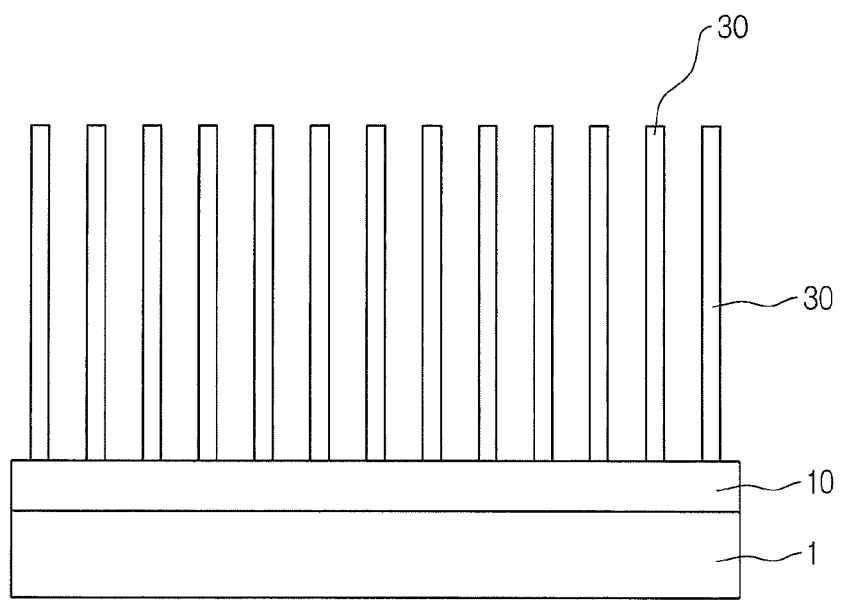

Referring to FIG. 4C, the nanowire 30 may be grown from each nano-nucleus by immersing the substrate 1 on which the nano-nuclei are formed into a solution in which a nanomaterial is dissolved.

Figure 4D:
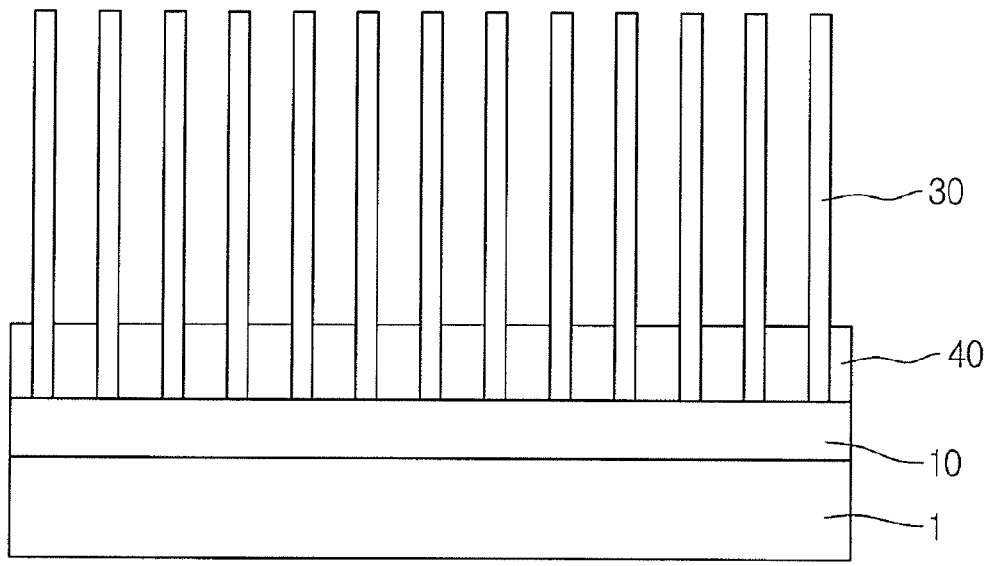

Referring to FIG. 4D, the active layer 40 may be formed on the first electrode 10 on which the nanowire 30 is formed. As described above, the active layer 40 may include a material which may absorb light such as sunlight and produce excitons. For example, in one exemplary embodiment the active layer 40 may include an organic material, an inorganic material, an organic-inorganic composite, or other suitable material.

Exemplary embodiments include configurations wherein the active layer 40 may be formed on the first electrode 10 by spin coating, dip coating, evaporation, or other similar methods. The active layer 40 may be formed to have a suitable thickness depending on a kind of the material of the active layer 40. For example, in the exemplary embodiment wherein the active layer 40 made of an organic material, the active layer 40 may be formed to have a thickness of from about 100 nm to about 200 nm.

Figure 4E:
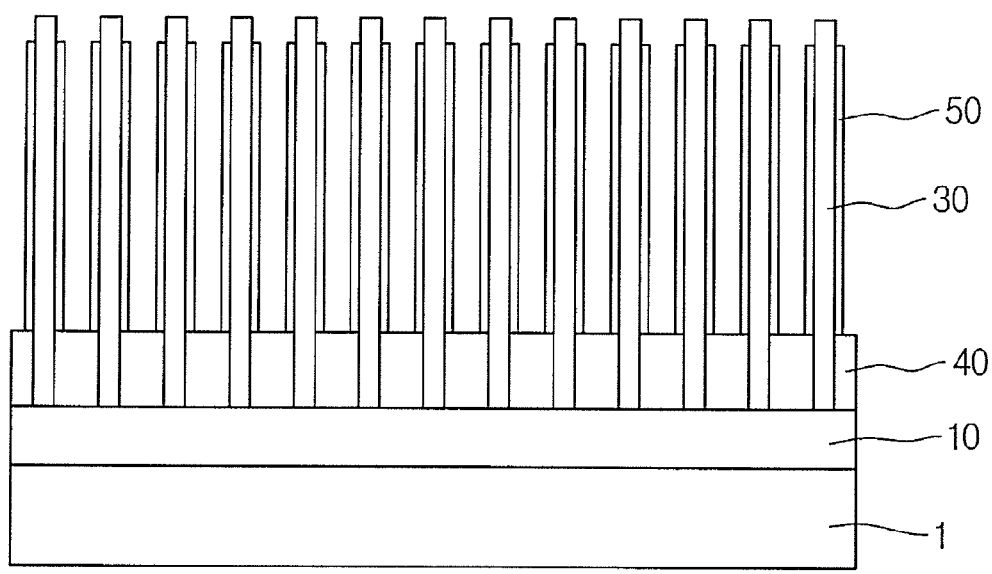

Referring to FIG. 4E, the insulating film 50 may be formed on the nanowire 30. The insulating film 50 serves to electrically separate the nanowire 30 from the conductive layer which is to be formed subsequently. Exemplary embodiments include configurations wherein the insulating film 50 may be formed on the surface of the nanowire 30 by spin coating, dip coating, evaporation, or other similar methods. For example, in one exemplary embodiment aluminum may be formed on the surface of the nanowire 30, and be anodized, thereby forming the insulating film 50 made of anodic aluminum oxide ("AAO").

In another exemplary embodiment, the insulating film 50 may be made of a piezoelectric material similarly to the nanowire 30. By surrounding the nanowire 30 with the insulating film 50 made of the piezoelectric material, piezoelectric characteristics of the nanowire 30 may be improved while the nanowire 30 is insulated. For example, in one exemplary embodiment the insulating film 50 may be made of at least one of PZT, BaTiO$_3$, other suitable materials and a combination thereof.

An end portion of the nanowire 30 is not be covered by the insulating film 50, but is exposed in order that the nanowire 30 may electrically contact the second electrode when the apparatus for generating electrical energy has one or both substrates 1 and 2 applied with a compression force. Therefore, the insulating film 50 may be formed to have such a height that the insulating film 50 does not entirely cover the end portion of the nanowire 30. When the insulating film 50 is formed to cover the entire nanowire 30, a portion of the insulating film 50 may be removed to expose the end portion of the nanowire 30. For example, in one exemplary embodiment the insulating film 50 may be partially removed using infrared ray ("IR") etching, plasma etching, or other similar methods.

Figure 4F:
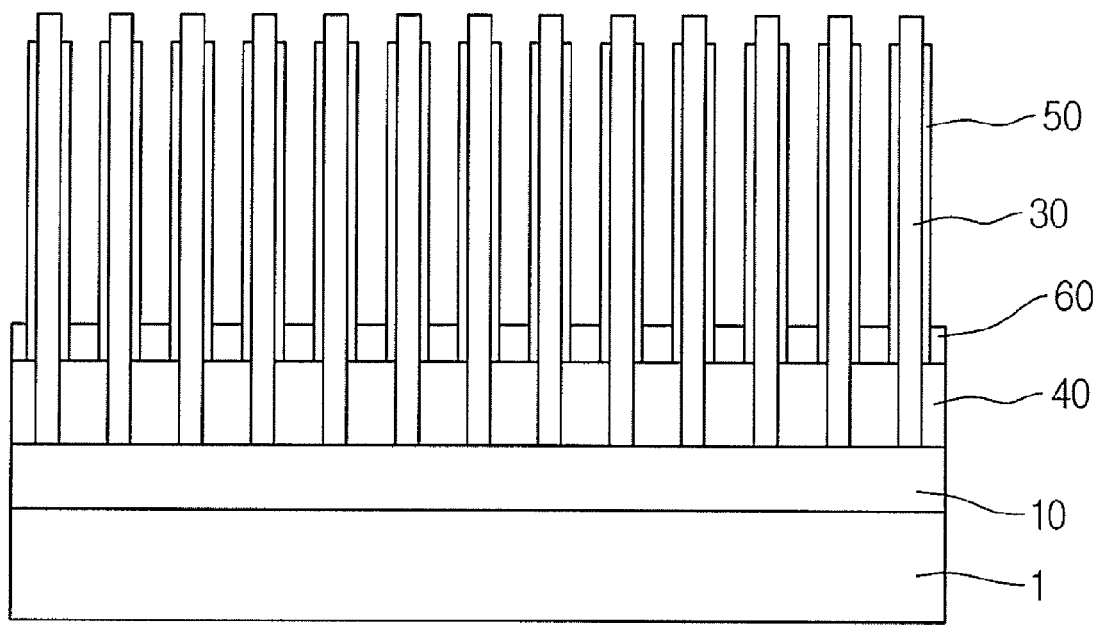

Referring to FIG. 4F, the conductive layer 60 may be formed on the active layer 40. Exemplary embodiments include configurations wherein the conductive layer 60 may include metal or other similar conductive materials. In an exemplary embodiment, the conductive layer 60 may be made of a transparent material. Exemplary embodiments include configurations wherein the conductive layer 60 may be formed to have a suitable thickness by spin coating, dip coating, evaporation, or other similar methods. For example, in one exemplary embodiment the conductive layer 60 may be formed to have a thickness from about tens of nanometers to hundreds of nanometers.

Similar to the above description regarding the insulating film 50, the conductive layer 60 may also be formed to have such a thickness that the conductive layer 60 does not entirely cover the nanowire 30. When the conductive layer 60 is formed to completely cover the nanowire 30, the conductive layer 60 may be partially removed by IR etching, plasma etching, or other suitable methods to expose the end portion of the nanowire 30.

By performing the processes described above with reference to FIGS. 4A to 4F, the first electrode, and the nanowire, the active layer, the insulating film, and the conductive layer disposed on the first electrode may be formed.

FIGS. 5A to 5G are cross-sectional views illustrating exemplary embodiments of processes of manufacturing the portion of a second electrode in an exemplary embodiment of an apparatus for generating electrical energy.

Figure 5A:
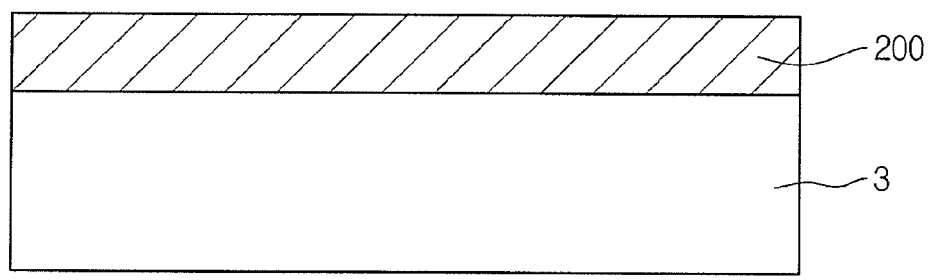
FIGS. 5A to 5G are cross-sectional views illustrating additional processes of an exemplary embodiment of a method for manufacturing an exemplary embodiment of an apparatus for generating electrical energy.

Referring to FIG. 5A, a metal layer 200 may be formed on a template substrate 3. In an exemplary embodiment, a silicon wafer may be used as the substrate 3. In an exemplary embodiment, the metal layer 200 may be made of aluminum (Al).

Figure 5B:
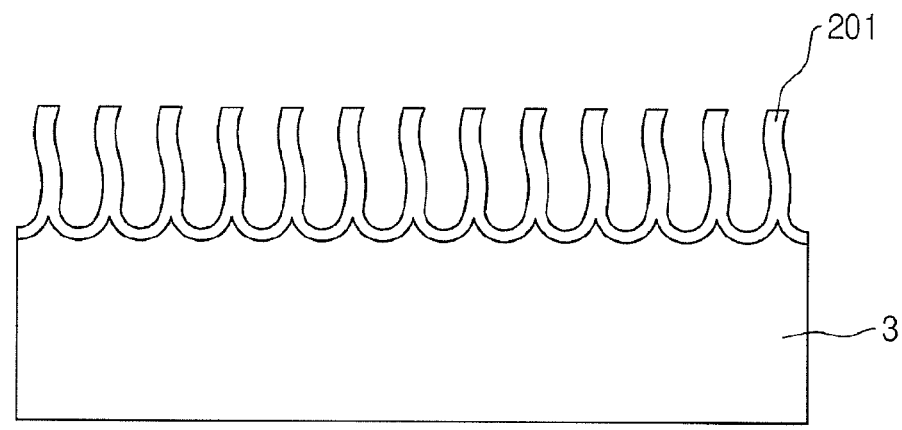

Referring to FIG. 5B, the metal layer 200 may be anodized to form an anodizing film 201. Anodizing disclosed herein may refer to the process of electrolysis in an electrolytic solution using the metal layer 200 as a cathode. Components of the metal layer 200 may be dissolved in the electrolyte through the anodizing process, and at the same time, a thickness of a natural oxide film formed on the metal layer 200 may be increased. Therefore, the anodizing film 201 having a structure as illustrated in FIG. 5B may be formed.

Figure 5C:
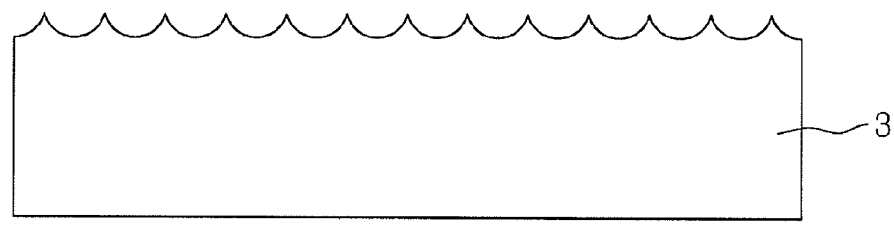

Referring to FIG. 5C, the anodizing film 201 formed through the anodizing process as described above may be removed. For example, in one exemplary embodiment the anodizing film 201 may be removed by wet etching or dry etching. The template substrate 3 after the anodizing film 201 has been removed may include an uneven portion having a ripple-shape structure.

Figure 5D:
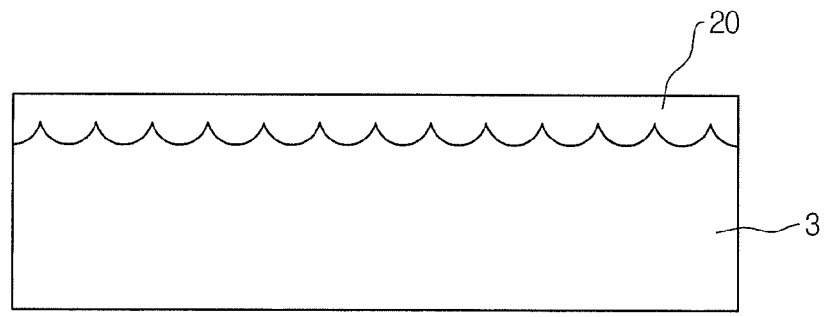

Referring to FIG. 5D, a second electrode 20 may be formed on the template substrate 3. The second electrode 20 may serve as an upper electrode to be in contact with the nanowire 30 and allow current to be generated. In one exemplary embodiment, the second electrode 20 may be made of a conductive material. Exemplary embodiments include configurations wherein the second electrode 20 may be formed by plating, sputtering, e-beam evaporation, thermal evaporation, or other similar methods. The second electrode 20 may serve as the upper electrode to be in contact with the nanowire 30 and allow current to be generated.

Figure 5E:
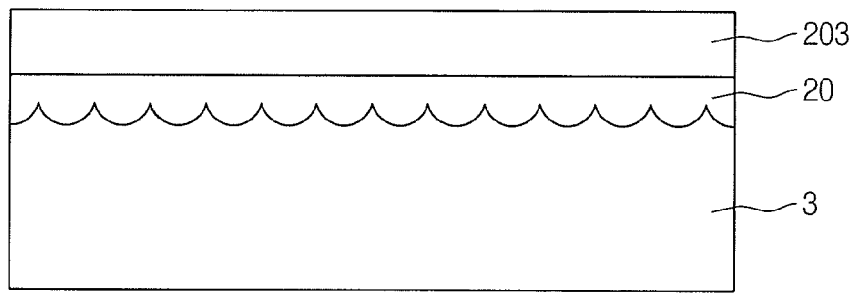

In an exemplary embodiment as illustrated in FIG. 5E, an adhesion layer 203 may be formed on the second electrode 20. The adhesion layer 203 may be a layer for enhancing adhesion between the second electrode 20 and a transport substrate, which will be formed later. In an exemplary embodiment, the adhesion layer 203 may include nickel (Ni). Furthermore, exemplary embodiments of the adhesion layer 203 may be formed by electroplating.

Figure 5F:
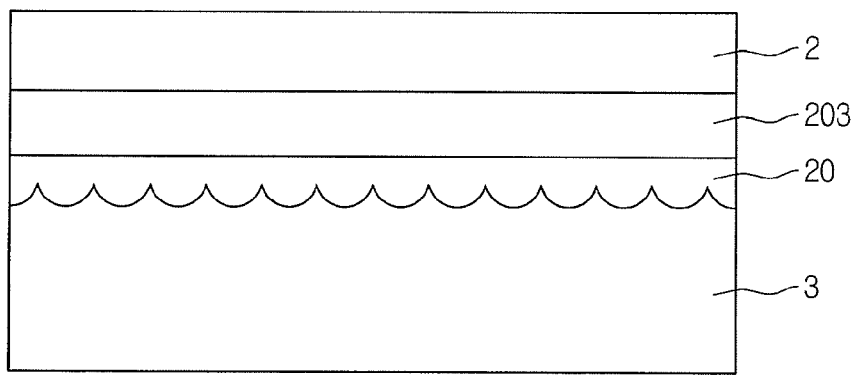

Referring to FIG. 5F, the substrate 2, acting as a transport substrate, may be adhered to the adhesion layer 203. In another exemplary embodiment, the substrate 2 may be directly adhered to the second electrode 20 without the adhesion layer 203. In an exemplary embodiment, the transport substrate 2 may include a polymer.

Figure 5G:
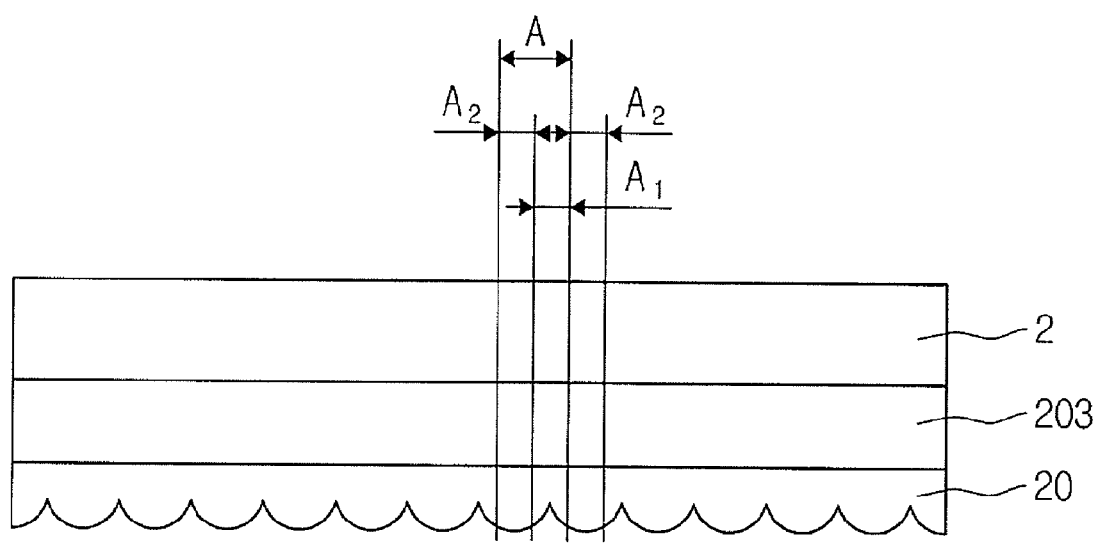

Referring to FIG. 5G, the second electrode 20, the adhesion layer 203, and the substrate 2 may be separated from the template substrate 3. The separated second electrode 20 may include an uneven portion A having a concave portion A1 and a convex portion A2 due to the shape of the template substrate 3.

Through the processes described above with reference to FIGS. 5A through 5g, the second electrode 20 having the uneven portion A may be formed.

In other exemplary embodiments, the second electrode 20 may have a substantially planar flat plate shape which does not have uneven portions A. Exemplary embodiments wherein the second electrode 20 have a substantially planar flat plate shape may be formed by forming a conductive material on the substrate 2 using plating, sputtering, e-beam evaporation, thermal evaporation, or other similar methods.

Figure 6A:
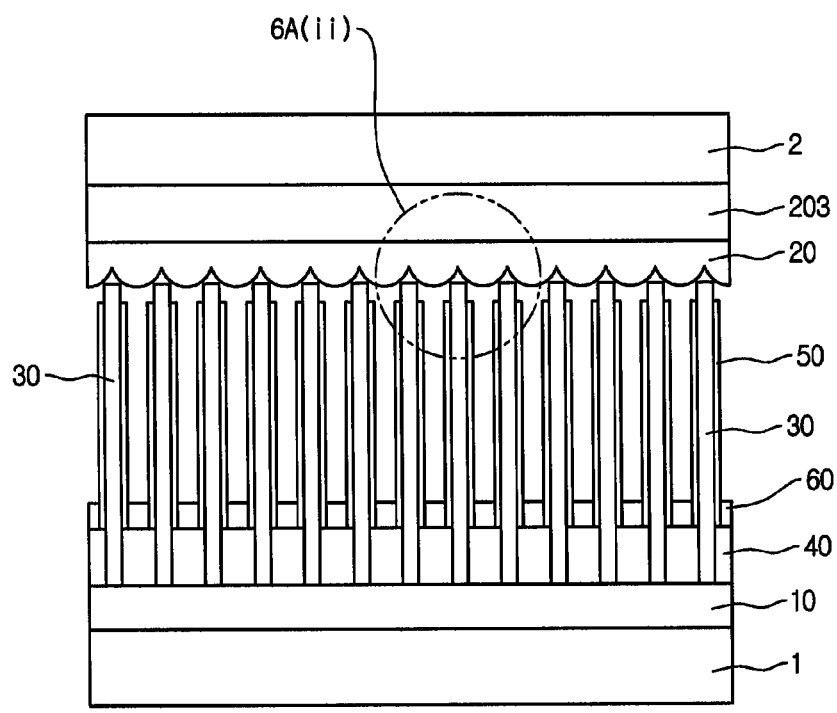
FIGS. 6A(i), 6A(ii) and 6B are cross-sectional views illustrating still additional processes of an exemplary embodiment of a method for manufacturing an exemplary embodiment of an apparatus for generating electrical energy.
Figure 6A:
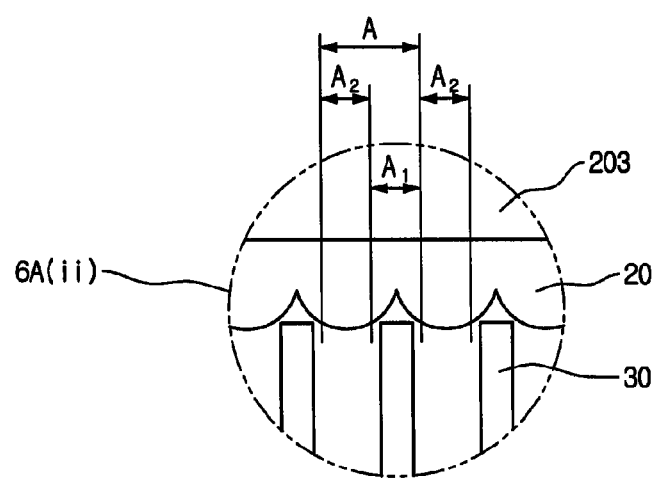

FIGS. 6A(i), 6A(ii) and 6B are cross-sectional views illustrating exemplary embodiments of processes for completing the manufacture of an exemplary embodiment of an apparatus for generating electrical energy by disposing the nanowire 30 and the second electrode 20 in proximity to each other in a method for manufacturing an exemplary embodiment of an apparatus for generating electrical energy.

Referring to FIG. 6A(i) and FIG. 6A(ii), which is a magnified view of the region 6A(ii) of FIG. 6A(i), the nanowire 30 may be disposed in proximity the second electrode 20. Here, the nanowire 30 may be in contact with the second electrode 20 or may be disposed to be spaced apart from the second electrode 20. In an exemplary embodiment, when the second electrode 20 has the uneven portion A, the nanowire 30 may be disposed in proximity to the concave portion A1 of the uneven portion A of the second electrode 20.

Although FIG. 6A(i) illustrates an exemplary embodiment in which the second electrode 20 has the uneven portion A, alternative exemplary embodiments include configurations wherein the second electrode 20 may have a substantially planar flat plate shape which does not have the uneven portion A.

Figure 6B:
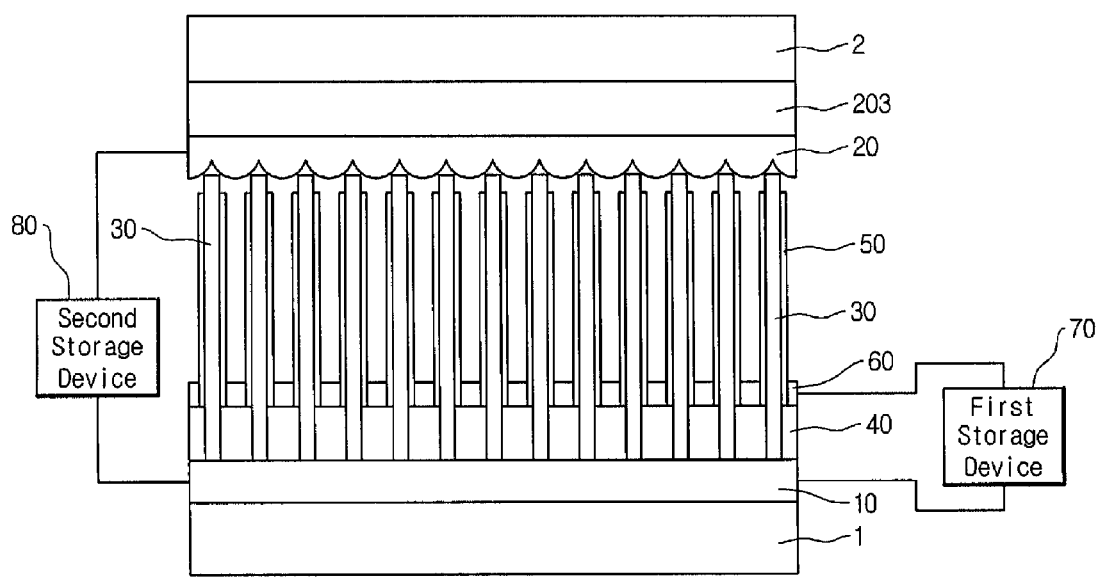

Referring to FIG. 6B, the first electrode 10 and the conductive layer 60 may be electrically connected to each other. For example, the first electrode 10 and the conductive layer 60 may be electrically connected by way of the first storage device 70. Electrical energy generated as the active layer 40 absorbs light may be stored in the first storage device 70.

Furthermore, the first and the second electrodes 10 and 20 may be electrically connected to each other. For example, the first and the second electrodes 10 and 20 may be electrically connected by way of the second storage device 80. Electrical energy generated when the nanowire 30 is bent as a stress is applied to the nanowire 30 or when the nanowire 30 vibrates as a resonance signal is applied to the nanowire 30 may be stored in the second storage device 80.

While the exemplary embodiments have been shown and described, it will be understood by those skilled in the art that various changes in form and details may be made thereto without departing from the spirit and scope of this disclosure as defined by the appended claims.

In addition, many modifications may be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

What is claimed is:

1. A method for manufacturing an apparatus for generating electrical energy, the method comprising:
    disposing a nanowire including a piezoelectric material on a first electrode;
    disposing an active layer, which is electrically connected to the nanowire, on the first electrode;
    disposing an insulating film on the nanowire;
    disposing a conductive layer on the active layer; and
    disposing a second electrode in proximity to the nanowire and substantially opposite to the first electrode.

2. The method according to claim 1, further comprising:
    electrically connecting a first storage device between the first electrode and the conductive layer; and
    electrically connecting a second storage device between the first electrode and the second electrode.

3. The method according to claim 1, wherein disposing the second electrode in proximity to the nanowires further comprises:
    forming a metal layer on a template substrate;
    anodizing the metal layer to form an anodized film;
    removing the anodizing film to form the second electrode on the template substrate;
    joining the second electrode to a transport substrate; and
    separating the second electrode and the transport substrate from the template substrate.

4. The method according to claim 1, wherein at least one of the first electrode, the second electrode, and the conductive layer include a transparent material.

5. The method according to claim 1, wherein the active layer includes one of an organic material, an inorganic material, and an organic-inorganic composite.

6. The method according to claim 1, wherein the insulating film includes a piezoelectric material.

7. The method according to claim 6, wherein the insulating film includes at least one selected from the group consisting of lead-zirconate-titanate, barium titanate and a combination thereof.

8. The method according to claim 1, wherein the first electrode, the second electrode, and the conductive layer include at least one selected from the group consisting of a metal, indium tin oxide, carbon nanotubes, graphene, conductive polymer, nanofibers, nanocomposites and a combination thereof.

* * * * *